United States Patent [19]

Iida et al.

[11] Patent Number: 5,407,557

[45] Date of Patent: Apr. 18, 1995

[54] WIRING BOARDS AND MANUFACTURING METHODS THEREOF

[75] Inventors: Atsuko Iida; Hiroshi Odaira, both of Kanagawa; Yoshizumi Sato; Yuichi Yamamoto, both of Tokyo, all of Japan

[73] Assignee: Kabushiki Kaisha Toshiba, Kanagawa, Japan

[21] Appl. No.: 201,325

[22] Filed: Feb. 24, 1994

Related U.S. Application Data

[62] Division of Ser. No. 724, Jan. 5, 1993, Pat. No. 5,310,966.

[30] Foreign Application Priority Data

Feb. 17, 1992 [JP] Japan .................................. 4-029129

[51] Int. Cl.⁶ .................................................. C25D 5/02
[52] U.S. Cl. ............................... 205/125; 204/192.11; 204/192.17; 205/129; 205/152; 205/317; 205/320; 205/323; 205/917; 427/96; 427/97; 427/597; 427/552; 427/553; 427/556
[58] Field of Search ........................ 204/192.11, 192.17; 205/125, 129, 152, 317, 320, 323; 427/96, 97, 597, 552, 553, 555, 556

[56] References Cited

U.S. PATENT DOCUMENTS

| | | | |
|---|---|---|---|
| 4,370,391 | 1/1983 | Mori et al. | 428/697 |
| 4,388,517 | 6/1983 | Schulte et al. | 427/555 |
| 4,961,979 | 10/1990 | Iida et al. | 428/64 |
| 4,996,075 | 2/1991 | Ogawa et al. | 427/597 |

FOREIGN PATENT DOCUMENTS

| | | |
|---|---|---|
| 62-109397 | 5/1987 | Japan . |
| 63-285997 | 11/1988 | Japan . |
| 3155933 | 7/1991 | Japan . |
| 417218 | 1/1992 | Japan .................................. 427/555 |

*Primary Examiner*—John Niebling
*Assistant Examiner*—Edna Wong
*Attorney, Agent, or Firm*—Finnegan, Henderson, Farabow, Garrett & Dunner

[57] ABSTRACT

A multi-layer wiring board where a plurality of wiring boards are laminated. The wiring board comprises a flexible insulating layer having a through hole and a wiring pattern formed on the flexible insulating layer. The wiring pattern is composed at least of two conductive layers. The first conductive layer formed on the insulating layer is made of a non-metallic conductor and the first wiring pattern is formed by a laser beam. The second conductive layer is an electroplated layer formed on the first wiring pattern. The first and second conductive layers have different reflectance for a beam. The wiring board is manufactured by integrally laminating a plastic conductive supporting plate wound in a roll shape and an insulating film similarly wound in a roll shape; forming a through hole in a predetermined position of the insulating film; forming the first conductive layer on the laminated body provided with the through hole; forming the first wiring pattern by a laser beam; and forming the electroplated layer on the first wiring pattern.

15 Claims, 5 Drawing Sheets

WIRING BOARDS AND MANUFACTURING METHODS THEREOF

This is a division of application Ser. No. 08/000,724, filed Jan. 5, 1993, now U.S. Pat. No. 5,310,966.

BACKGROUND OF THE INVENTION

1. Field of the Invention

The present invention relates to a wiring board with a fine wiring pattern adapted for a circuit device mounted with, e.g., semiconductive elements and chip parts, and manufacturing method thereof.

2. Description of the Related Art

Generally, a wiring board (wiring circuit substrate) is conventionally manufactured by a method where a copper foil, which is adhered to the surface of an insulating plate such as a glass epoxy resin plate with an adhesive, is subjected to photoengraving process (PEP) to form a desired wiring pattern. Further, a board with multi-layer wiring, which is manufactured for highly densifying a wiring and compacting a wiring board, has been known. These multi-layer wiring boards are manufactured by a method where a plurality of the above mentioned insulating plates with a desired wiring pattern are laminated, for example, via an adhesive layer and then processed under heat and pressure to be integrated together; and thereafter holes, which continuously connect between the desired wiring patterns, are perforated in the direction of the thickness such that the desired wiring patterns are electrically connected, for example, by an electroplated layer, via these perforated holes.

In the above method for manufacturing a wiring board, the following methods for the formation of a wiring pattern have also been known; One method is that instead of a copper foil, a metal layer formed by vapor deposition or sputtering method is subjected to photoengraving process to form a pattern. The other method is that chemical plating or electroplating is further conducted on the previously mentioned pattern to reduce the wiring resistance.

Figure 1:
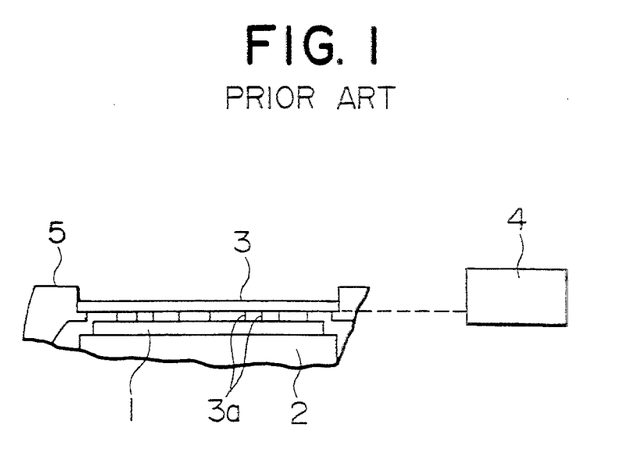
FIG. 1 is a view schematically illustrating an embodiment of an electric examination of a wiring board manufactured by a conventional manufacturing method.

In any wiring boards manufactured by the above methods, only conductors of particular parts (particular areas) of a wiring pattern are formed independently of each other so as to electrically connect to electric parts to be mounted on the surface. An electric examination (open check) is conducted by the use of a special tool with standing needle-shape terminals which respectively correspond to exposed conductive parts independent of each other. For example, as shown in FIG. 1, a wiring board (wiring circuit substrate) 1 is placed on a special stand 2, a special tool 3 (generally called as a probe card) with erected needle-shape terminals 3a intimately contacts at the position corresponding to exposed conductive parts formed independently of each other on the surface of the wiring board 1, and then an electric examination is conducted by a tester 4.

However, in the above wiring board, there are following problems with respect to the manufacturing method thereof. First, in the case where the conductive metallic layer (foil) is subjected to selective etching to form a predetermined wiring pattern, a series of processes called "the photoengraving process", that is, the formation of a photoresist film, selective exposure with a exposure mask (accuracy for the position of an exposure mask is particularly important), development and selective etching are required. Particularly, in the case of a multi-layer wiring board, during or after the laminating process, it is necessary to form through or non-through holes for electric connection between desired wiring pattern layers and to make conductive the holes. As a result, processes become further complicated and facilities for manufacturing or processing become larger. Second, in practicing a manufactured wiring board, an examination for the function thereof as a required electric circuit is necessary. However, as described above, this electric examination requires the use of a tool in which terminal positions for each wiring pattern are designed. Thus, at each time of changing a wiring pattern, the tool must be designed, formed and selected. In addition, in the examination process, it takes much time to set the wiring board 1 and tool 3 as shown in FIG. 1 and the examination itself is complicated. Thus, as a wiring pattern becomes of multi-layer structure or finer, these problems become greater. In other words, the electric examination becomes considerably complicated and further the probability of connection defects increases, resulting in lowering yield in a multi-layer wiring board and reliability of a product.

SUMMARY OF THE INVENTION

An object of the present invention is to provide a wiring board with a high reliability capable of a multi-layer wiring pattern and fine wiring pattern, which can be manufactured by relatively simple processes without a conventional photoetching process and each of formed wiring pattern layer can be subjected to necessary electrical check, and a manufacturing method thereof.

A multi-layer wiring board of the present invention comprises a laminate in which a plurality of wiring boards are laminated, each of the wiring boards comprising an insulating layer made of a flexible insulating material and a wiring pattern formed on the insulating layer. Through holes are formed at predetermined positions in the insulating layer. These through holes are capable of electrically connecting both the surface of the insulating layer and wiring pattern. The wiring pattern is formed at least on the through holes. The wiring pattern comprises a first conductive non-metallic layer patterned by the irradiation of an energy beam, and a second conductive metallic layer formed by electroplating on the surface of the first conductive non-metallic layer.

Suitable flexible insulating materials include organic polymers such as polyimide, polycarbonate, polyester, polyetheretherketone, polyetherimide and polyphenylene sulphide.

A metal oxide represented by MeOx is used as the first conductive non-metallic layer. In this formula, Me represents a metal capable of forming an oxide. Ni, Cu, Ti, Cr, Zn, Fe, Co, V, Nb, Mo, Pd, Ag, In, Sb, Ta, W, Ir, Pb and Sn are selected as a metallic material suitable for forming the first conductive non-metallic layer of this invention. In the formula, x represents a mole ratio of an oxygen atom to 1 mole of a metal atom. The mole ratio x of an oxygen atom in an oxide of a preferred embodiment of this invention is required to the preferred embodiment of be $0.1 < x < 0.8$. Such a limitation of the mole ratio of an oxygen atom is based on the following reasons. Namely, in the formation of a wiring pattern in a wiring board according to this invention, the above first conductive layer, which is formed on an organic polymer film insulating layer by means of e.g. sputtering, is irradiated by a relatively low energy beam such as a semiconductor laser so that irradiated parts are scattered and disappeared, permitting the formation of a predetermined pattern. The limitation of the mole ratio of an oxygen atom enables the above first non-metallic conductive layer used in a wiring board of this invention to have a preferably ranged reflectance and absorptance for the wave length of the beam irradiated by the semiconductor laser. The reflectance r and absorptance a of the first non-metallic conductive layer for a light of a 830 nm wave length are limited to be $25\% < r < 60\%$ and $20\% < a < 60\%$, respectively. If they are out of these ranges, a satisfactory pattern can not be formed.

The second conductive metallic layer is formed on the first conductive layer by electroplating. The material thereof is required to have a reflectance for a laser beam different from that of the first non-metallic conductive layer. Metallic materials with the reflectance at least 60% and the absorptance at most 20% are used. Besides Cu, a metal or alloy such as Ni and solder may be used.

A method for manufacturing a wiring board of the present invention comprises the steps of integrally laminating an insulating layer on the surface of a conductive supporting plate, the insulating layer having through holes perforated in a predetermined position of the insulating layer for enabling substantially electrical connection to the supporting plate; forming a first conductive layer on the insulating layer, the first conductive layer electrically connecting to the supporting plate via the through hole; irradiating a semiconductor laser beam on the first conductive layer to form a desired wiring pattern on the insulating layer; and electroplating the surface of the wiring pattern while the supporting plate serves as one electrode, to deposit and form a second conductive metallic layer. Thus, a first wiring board having the wiring patterns is obtained.

Further, in order to obtain a multi-layer wiring board, the following processes are repeated to obtain necessary layers. These processes comprise the step of integrally laminating an insulating layer on the surface of the first wiring board, the insulating layer having perforated through holes for forming an area capable of electric connection to a supporting plate; forming a first conductive non-metallic layer electrically connecting to the supporting plate; irradiating the laser beam to form a wiring pattern; and forming a wiring pattern, which is made of a second conductive metal having a reflectance different from that of the first conductive layer surface, on the surface of the wiring pattern by electroplating.

A metal thin plate such as stainless, copper and aluminum is used as a conductive supporting plate. An organic polymer such as polyimide, polycarbonate, polyester, polyetheretherketone, polyetherimide and polyphenylene sulphide is used as a material for the insulating layer to be laminated.

Through holes are preferably perforated on the above insulating layer by non-contact means such as irradiation of a laser beam. The through holes may be perforated after the insulating layer is integrally formed on the surface of the conductive supporting plate.

The above first conductive layer is formed by reactive sputtering using, for example, a metal sputtering device and a predetermined metal as a target in a mixture gas of argon and oxygen. Then, the pattern of the first conductive layer is formed by irradiation with a semiconductor laser beam having a relatively low power by the use of a laser drawing machine.

In the above method for manufacturing a wiring board according to the preferred embodiments of this invention, the reflectance of the first non-metallic conductive layer (wiring pattern), which constitutes a base, and second metallic layer (wiring pattern), which is laminated on the first non-metallic conductive layer, are different from each other. Based on this difference, these reflectance are visually and optically observed to determine whether the reflectance of a formed wiring pattern is uniform; in other words, whether there is only the reflectance of the second metallic layer; or whether the reflectance of the first conductive layer (wiring pattern) also exists. In such a way, electric connections can be examined. For example, if there is a disconnection in a certain wiring pattern so that satisfactory electroplating process is not conducted, this disconnection can be easily found by a visual examination due to the difference in optical constant between the first conductive non-metallic layer and second metallic layer. Further, if a wiring pattern is so fine that observation by use of CCD and a laser light is necessary, the electric examination can be sufficiently conducted by a control device such as a laptop computer and personal computer based on CAD data of the wiring pattern.

According to the method for manufacturing a wiring board of the preferred embodiments of the present invention, through holes are perforated on predetermined parts of an insulating layer by irradiation of a laser beam and the like. The insulating layer is integrally laminated and formed on the surface of a conductive supporting plate. Thereafter a first conductive pattern, which is electrically connected to the conductive supporting plate via through holes, is formed, and a second conductive pattern is laminated on the surface of the first conductive layer by electroplating. Namely, the wiring pattern of the present invention comprises two conductive layers. The surface reflectance of the first conductive layer is different from that of the second conductive layer. This permits easy and certain examination and judgement whether or not a wiring pattern has no wiring disconnection and high reliability at the time of forming a fine wiring pattern. Thus, in each process of forming a wiring pattern layer, the examination and judgement can be conducted and the wiring pattern is necessarily and correctly repaired to improve the yield and the reliability of circuit functions.

BRIEF DESCRIPTION OF THE DRAWINGS

FIGS. 5a, 5b, 5c and 5d are views schematically illustrating an embodiment of sequent processes in a method for manufacturing a wiring board in according to the present invention.

DESCRIPTION OF THE PREFERRED EMBODIMENT

Referring now to FIGS. 2, 3, 4, 5a, 5b, 5c, 5d and 6, embodiments of this invention will be described.

Example 1

Figure 2:
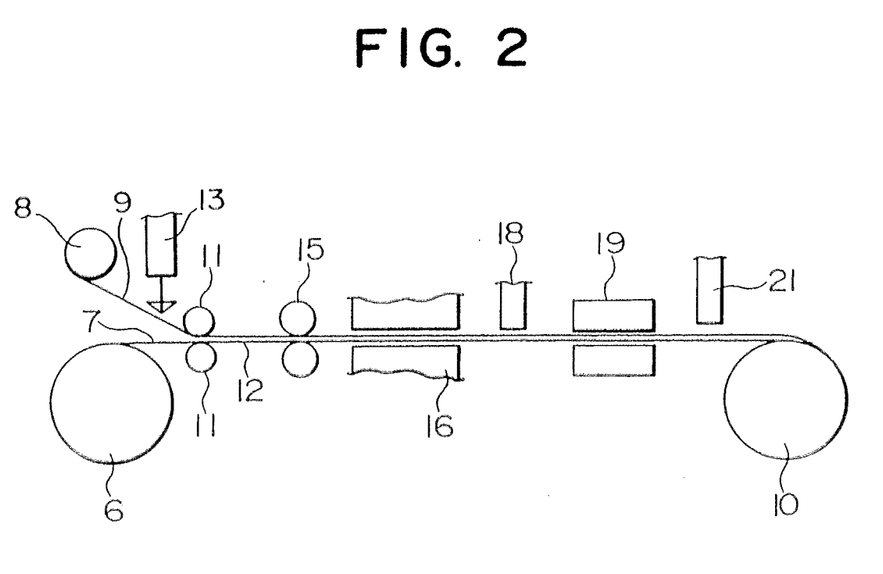
FIG. 2 is a side view schematically illustrating an embodiment of a method for manufacturing a wiring board according to the present invention.

The processes of the manufacturing method according to this the preferred embodiment of invention are schematically shown in FIG. 2. A stainless thin plate 7 with a 100 μm thickness, which serves as a supporting plate, was wound around a supplying roller 6. A polyimide film 9 with a 20 μm thickness, which serves as an insulating film, was wound around another supplying roller 8. The surface of the polyimide film 9, which contacted with the stainless plate 7, was coated with an adhesive. Then, the polyimide film 9 being fed from the supplying roller 8 was selectively irradiated in predetermined areas of the polyimide film 9 with a laser beam, for example an excimer laser, by a laser perforator 13 to perforate a hole 14. The stainless plate 7 being fed from the supplying roller 6 and the perforated polyimide film 9 passed through a thermocompression bonding roller 11 to be compressed and integrated together (FIG. 5a).

The stainless plate-polyimide film laminated body 12, where the required holes 14 were formed, was subsequently degreased, cleaned and dried via a cleaning device 15. In the resultant laminated body 12, a first conductive non-metallic layer 17 composed of NiOx is integrally deposited on the surface of the polyimide film 9 by a metal sputtering device 16 (FIG. 5b). This sputtering was conducted under conditions that a Ni metal is used as a target and reactive sputtering is carried out in a mixture gas of an argon gas and oxygen, to form the NiOx conductive layer 17. The color of this NiOx layer was black including brown in a visible light region, and the NiOx layer had a thickness of 80 nm, a sheet resistance of 200Ω, a reflectance of 25% and an absorptance of 46% in a wave length 830 nm. Thereafter, the obtained first conductive layer 17 was irradiated with a laser beam by a laser drawing machine 18 using a semiconductor laser to form a predetermined wiring pattern 17' (FIG. 5c). In forming this wiring pattern, the irradiation of the laser beam was converged and scanned such that the diameter of the laser beam was 1 μm on the surface of the first conductive layer 17. As a result, the irradiated parts of the conductive layer 17 were scattered in a 1 μm width to form the wiring pattern 17' with a 20 μm line width and wiring resistance 800 kΩ/cm.

Figure 5A:
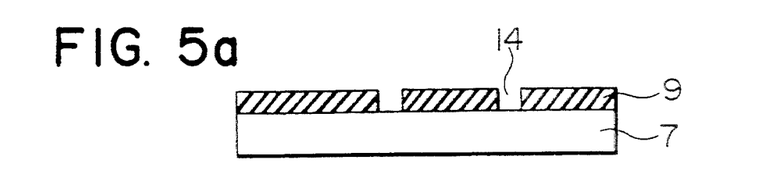
FIG. 5a is a sectional view illustrating the state that an insulating layer in which desired through holes are perforated is integrally laminated on a conductive supporting plate.
Figure 5B:
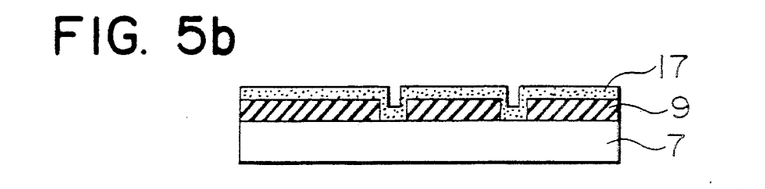
FIG. 5b is a sectional view illustrating the state that a first conductive layer is deposited and formed.
Figure 5C:
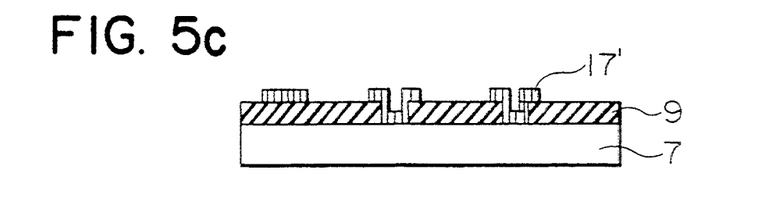
FIG. 5c is a sectional view illustrating the state that the first conductive layer is processed into a wiring pattern.
Figure 5D:
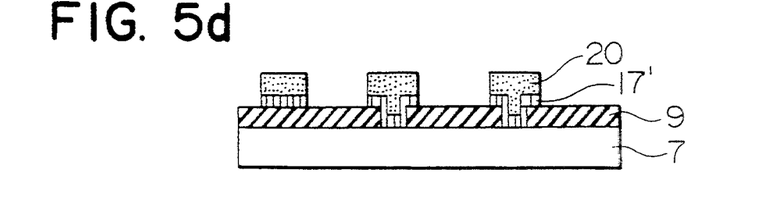
FIG. 5d is a sectional view illustrating the state that a second metallic conductive layer is formed on the wiring pattern surface of the first conductive layer by electroplating.

Copper plating was carried out on the wiring pattern 17' of the first conductive layer 17 thus obtained by an electroplating device 19 while the stainless plate 7 served as one electrode to form a wiring pattern 20 with a 10 μm thickness composed of a second conductive metallic layer (FIG. 5d). This wiring pattern 20 has a line width of 20 μm and a wiring resistance of 1Ω. The connection resistance of the hole 14 with a diameter of 50 μm was 100 mΩ. The wiring pattern 20 composed of a copper layer, which was the second metallic layer, had a reflectance of 85% and an absorptance of 8% in a wave length 830 nm and the copper color with glossiness in a visible light region. Thus, it could easily be judged whether or not the wiring pattern 20 composed of the second metallic conductive layer was formed as designed or had any disconnecting areas on the basis of the differences from the first wiring pattern 17' in a reflectance and color. Such a judgement for the wiring pattern 20 was conducted in the process of winding around a wound roller 10 after the wiring pattern 20 composed of the second metallic layer has been formed. For example, a visual detecting mechanism or optical scanning mechanism 21, which can measure a reflectance by using CCD or various laser lights, was provided in front of the winding roller 10 so that it could be readily detected e.g. whether or not there was a disconnection at each time of the formation of a predetermined wiring pattern.

Figure 6:
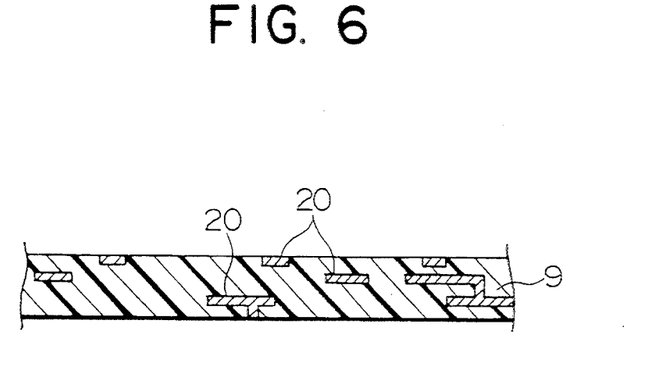
FIG. 6 is a sectional view schematically illustrating an embodiment of a multi-layer wiring board manufactured by a method according to the present invention.

After forming the second wiring pattern 20, in a similar manner to FIGS. 2 and 5a, b, c, d, a hole 14 was perforated in predetermined positions of a polyimide film 9 and then the polyimide film 9 was adhered to the surface where the second wiring pattern 20 was formed. Thereafter, in a similar manner to that as described above, a first wiring pattern 17' composed of NiOx and second wiring pattern 20 composed of copper were laminated and a predetermined wiring pattern was formed. Such processes were repeated to manufacture a multilayer wiring board having a sectional structure as shown in FIG. 6. Further, at the time of forming a wiring pattern of each a layer, visual examination for disconnections in a wiring pattern 20 could be readily conducted to obtain a wiring board having circuit functions of high reliability with good yield.

Example 2

The first non-metallic conductive layer constituting a wiring pattern of this invention will now be described in details. In this embodiment, description, which relates to processes for junction between a supporting substrate and insulating film, and formation of through holes in predetermined positions of the insulating film, are omitted.

Example 2-a

Figure 3:
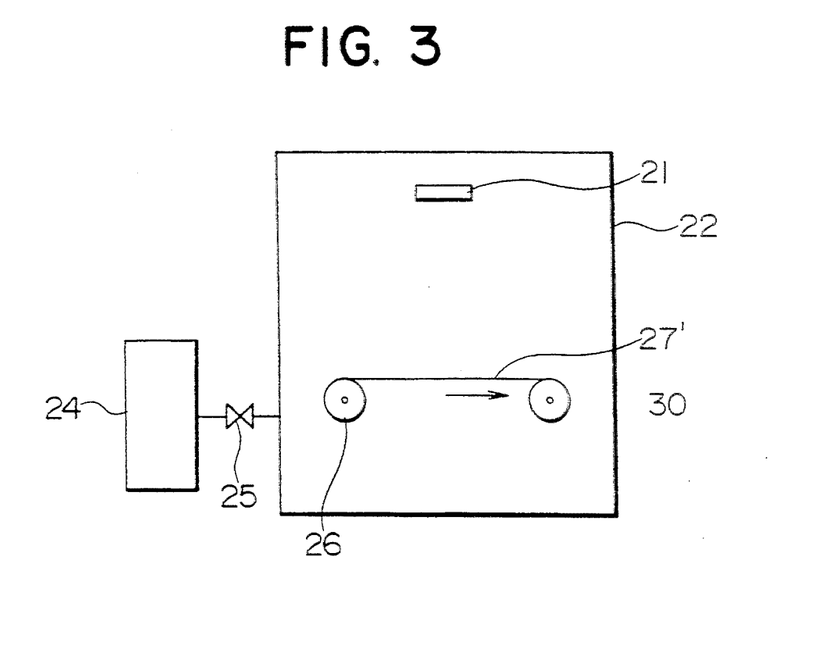
FIG. 3 is a view schematically illustrating an embodiment of the process for depositing and forming a first conductive layer on an insulating layer according to the present invention.

FIG. 3 is a schematic view showing a method for depositing a first non-metallic conductive layer on the surface of an insulating layer. A polyester film 27 with a 50 μm thickness, which had previously been wound around a roll 26, was set within a sputtering vacuum vessel 22 provided with a target 21 of a copper metal. While the film was unwound, reactive sputtering was carried out in a mixture gas of argon and oxygen to form a black film of a copper oxide on the film. In FIG. 3, reference numeral 24 denotes an exhaust system connecting to the vacuum vessel 22 via a valve 25. At this time, a gas pressure was 5 mTorr, a throughput of the mixture gas 28 sccm, a partial pressure ratio of an oxygen gas 15%. The applied power was 500 W. Under these sputtering conditions, a depositing speed was 45 nm/min., a film thickness 80 nm, a mole ratio x of CuOx film formed 0.4. The film 27' had a reflectance of 45% and an absorptance of 35% in a wave length 830 nm and a specific resistance $\rho$ of $2.1 \times 10^{-2}$ Ωcm.

Figure 4:
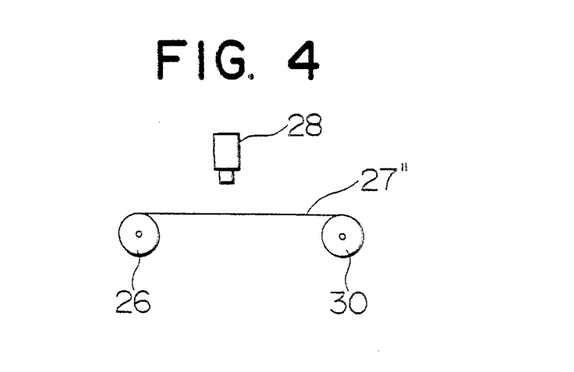
FIG. 4 is a view schematically illustrating an embodiment of the process for forming a wiring pattern of the first conductive layer according to the present invention.

FIG. 4 is a schematic view of a process for forming a desired using pattern on a wiring board by a laser light. While the film plate 27′ deposited the first non-metallic conductive layer thereon was wound, a GaAlAs semiconductor laser beam with a 830 nm wave length was converged and irradiated on the surface of the film by a GaAlAs semiconductor laser 28 such that the beam diameter was 5 μm. At this time, the output was 7 mW and a scanning speed of the laser was 100 mm/sec. In the irradiated parts a non-metallic layer film was scattered in a 5 μm width and a unnecessary non-metallic film was removed to form a desired wiring pattern 27″.

With respect to the above CuOx, an oxygen mole ratio x of the film, which was formed under a partial pressure ratio of an oxygen gas ranged from 8 to 20%, satisfied the relation, $0.2 < x < 0.8$ to enable the above mentioned wiring pattern. Particularly, in the case of a GaAlAs laser with a 830 nm wave length, sensitivity was high in the range, $0.2 < x < 0.5$. Further, even when a laser to be used was a semiconductor laser having the other wave length, the above mentioned wiring pattern could be formed. In addition, besides semiconductor lasers, for example, a helium neon gas laser with a 633 nm wave length or argon gas laser with a 488 nm wave length provided the same effects in the range, $0.2 < x < 0.8$, wherein x represents an oxygen mole ratio of the copper oxide film.

Example 2-b

Similarly to Example 2-a, a polyphenylene sulphide film with a 20 μm thickness, which had previously been wound in a roll form, was set within a sputtering vacuum vessel 22 provided with a target 21 of a nickel metal. While the film was unwound, reactive sputtering was carried out in a mixture gas of argon and oxygen to form a black film of a nickel oxide, NiOx with metallic glossiness on the film. At this time, a gas pressure was 6 mTorr, a throughput of the mixture gas 30 sccm, a partial pressure ratio of an oxygen gas 11%. The applied power was 500 W. Under these sputtering conditions, a depositing speed was 28 nm/min., a film thickness 50 nm, a mole ratio x of NiOx film formed 0.5. The film had a reflectance of 35% and an absorptance of 44% in a wave length 830 nm and a specific resistance $\rho$ of $7.2 \times 10^{-3}$ Ω.cm.

While this sample was wound, a GaAlAs semiconductor laser beam with a 830 nm wave length was converged and irradiated on the surface of the film such that the beam diameter was 1 μm. At this time, the output was 10 mW and a scanning speed of the laser was 100 mm/sec. In the irradiated parts a non-metallic layer film was scattered in a 1 μm width and an unnecessary non-metallic film was removed to form a desired wiring pattern.

With respect to the above NiOx film, an oxygen mole ratio x of the film, which was formed under a partial pressure ratio of an oxygen gas ranged from 10 to 15%, satisfied the relation, $0.2 < x < 0.8$ to enable the above mentioned wiring pattern. Particularly, in the case of a GaAlAs laser with a 830 nm wave length, sensitivity was high in the range, $0.5 < x < 0.7$. Further, even when the other laser was used, the same effects was obtained in the range, $0.4 < x < 0.7$.

In the above examples, a copper or nickel oxide was described as a metal oxide used for a non-metallic conductor. However, even when an oxide of the other metal, for example, Ti, Cr, Zn, Fe, Co, V, Nb, Mo, Pd, Ag, In, Sb, Ta, W, Ir, Pb or Sn, was used, the same effects could be obtained in the range, $0.1 < x < 0.8$ wherein x represents an oxygen mole ratio of a metal oxide, MeOx.

The results are shown in Table 1.

TABLE 1

|  | NiOx | CuOx | MeOx |
|---|---|---|---|
| mole ratio, x | $0.4 < x < 0.7$ | $0.2 < x < 0.5$ | $0.1 < x < 0.8$ |
| partial pressure of oxygen gas at the time of sputtering, P % | $10 < P < 15$ | $8 < P < 20$ | $5 < P < 20$ |
| absorptance a, % | $30 < a < 45$ | $20 < a < 55$ | $20 < a < 60$ |
| reflectance r, % | $25 < r < 55$ | $30 < r < 60$ | $25 < r < 60$ |
| specific resistance $\rho$, Ωcm | $10^{-4} < \rho < 1$ | $10^{-4} < \rho < 1$ | $10^{-4} < \rho < 1$ |

Electroplating can be readily carried out on the above first conductive film, while a supporting substrate acts as one electrode. Thus, an excellent method for manufacturing a wiring board can be provided wherein the resistance of a wiring is low due to adhesion of a thick conductive metal film and complicated conventional processes such as the formation of a photoresist film, selective exposure by an exposure mask, development and selective etching, can not be required.

A comparative example using a conventional glass epoxy board and the wiring board of this invention is shown in Table 2.

TABLE 2

|  | Present invention | Glass epoxy board |
|---|---|---|
| Wiring width W, μm | 10 | 100 |
| Wiring interval s, μm | 10 | 100 |
| Thickness of board, μm (Four-layer board) | total 210 | total 550 |
| Thickness of board: μm | 50 × 4 | 100 × 4 |
| Adhering layer: μm | coating of an adhesive 2 × 3 | use of prepreg* 50 × 3 |

*prepreg: Prepreg is a board whose constituent material is the same as that of a glass epoxy board and which is impregnated with an adhesive; Prepreg is necessary for adhesion between glass epoxy boards.

As mentioned above, compared with a conventional glass epoxy board, both the wiring width and wiring interval of a multi-layer wiring board of the present invention can be far finer to enable a high density of wiring and small size of a wiring board.

Further, since the thickness of a wiring board is thin as shown in the above example, these intermediate products can be supplied to each process in the state that they are wound around a roll or the like and obtained incomplete/complete products can be also treated in the state that they are wound around a roll. This permits successive manufacture and simplization of processes. In addition, in the wiring board of the present invention, an electric examination with respect to the quality of a wiring pattern can be readily conducted so that the number of examining processes is reduced and the reliability of quality increases.

What is claimed is:

1. A method for manufacturing a wiring board, comprising the steps of:

laminating integrally an insulating layer having at least one through hole on the surface of a conductive supporting plate, the through hole enabling electrical connection;

forming a non-metallic conductive layer on the insulating layer, the non-metallic conductive layer electrically connecting to the supporting plate via the through hole;

irradiating the non-metallic conductive layer with an energy beam to form a first wiring pattern; and electroplating the surface of the first wiring pattern while the supporting plate serves as one electrode, to laminate a metallic conductive layer and form a second wiring pattern.

2. The method of claim 1, wherein the insulating layer is an organic polymer.

3. The method of claim 1, wherein the non-metallic conductive layer is a metal oxide represented by a formula of MeOx, wherein Me is at least one metal selected from the group consisting of Ni, Cu, Ti, Cr, Zn, Fe, Co, V, Nb, Mo, Pd, Ag, In, Sb, Ta, W, Ir, Pb and Sn, and the mole ratio, x of an oxygen atom in the metal oxide satisfies $0.1 < x < 0.8$.

4. The method of claim 3, wherein the metal oxide is at least one selected from the group consisting of a copper oxide and nickel oxide.

5. The method of claim 1, wherein an absorptance a % of the non-metallic conductive layer satisfies $20 < a < 60$ and a reflectance r % satisfies $25 < r < 60$ for a beam with a wave length 830 nm.

6. The method of claim 5, wherein the metallic conductive layer has a reflectance of at least 60% and an absorptance no greater than 20%.

7. The method of claim 1, wherein the irradiating step is performed by irradiating with an energy beam from a semiconductor laser.

8. A method for manufacturing a wiring board comprising the steps of:

forming integrally an insulating layer having at least one through-hole on the surface of a conductive supporting plate;

forming a non-metallic conductive layer on the insulating layer;

patterning the non-metallic conductive layer to form a first wiring pattern located at least on the through-hole; and forming a second wiring pattern of a metallic conductive layer on the first wiring pattern.

9. The method of claim 8 wherein the layer formed by the step of forming a non-metallic conductive layer comprises a metal oxide represented by the general formula of MeOx, wherein Me is at least one metal selected from the group consisting of Ni, Cu, Ti, Cr, Zn, Fe, Co, V, Nb, Mo, Pd, Ag, In, Sb, Ta, W, Ir, Pb and Sn, and the mole ratio x of an oxygen atom in the metal oxide satisfies $0.1 < x < 0.8$.

10. The method of claim 8 wherein the step of forming a non-metallic conductive layer forms a layer comprising at least one metal oxide selected from the group consisting of copper oxide and nickel oxide.

11. The method of claim 8 wherein the step of forming a non-metallic conductive layer forms a layer having an absorptance of a % satisfying $20 < a < 60$ and a reflectance of r % satisfying $25 < r < 60$ for a wave length of 830 nm.

12. The method of claim 11 wherein the step of forming a second wiring pattern forms a metallic conductive layer having a reflectance of at least 60% and an absorptance no greater than 20%.

13. The method of claim 8 wherein the patterning step comprises irradiating with a laser beam.

14. The method of claim 8 wherein the forming step comprises the substep of electroplating the surface of the first wiring pattern.

15. The method of claim 14 wherein the electroplating step comprises the substep of using a supporting plate as an electrode.

* * * * *